United States Patent
Gupta et al.

(10) Patent No.: US 6,391,732 B1
(45) Date of Patent: May 21, 2002

(54) METHOD TO FORM SELF-ALIGNED, L-SHAPED SIDEWALL SPACERS

(75) Inventors: Subhash Gupta; Yelehanka Ramachandramurthy, both of Singapore (SG); Vijai Kumar Chhagan, Belgrave (GB)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 12 days.

(21) Appl. No.: 09/595,061

(22) Filed: Jun. 16, 2000

(51) Int. Cl.$^7$ .............................................. H01L 21/336
(52) U.S. Cl. ........................ 438/305; 438/595; 438/303
(58) Field of Search ................................ 438/303, 305, 438/595

(56) References Cited

U.S. PATENT DOCUMENTS

| | | | |
|---|---|---|---|
| 5,013,675 A | | 5/1991 | Shen et al. ..................... 437/44 |
| 5,498,555 A | | 3/1996 | Lin ............................... 437/35 |
| 5,573,965 A | * | 11/1996 | Chen et al. |
| 5,661,049 A | | 8/1997 | Lur et al. ...................... 438/303 |
| 5,811,342 A | * | 9/1998 | Wu ............................... 438/303 |
| 5,891,788 A | | 4/1999 | Fazam et al. ................. 438/439 |
| 5,899,722 A | | 5/1999 | Huang ......................... 438/305 |
| 5,925,918 A | * | 7/1999 | Wu et al. ..................... 257/413 |
| 6,146,946 A | * | 11/2000 | Wang et al. ................. 438/264 |
| 6,150,223 A | * | 11/2000 | Chern et al. ................. 438/303 |
| 6,200,858 B1 | * | 3/2001 | Kokubu ....................... 438/261 |
| 6,251,764 B1 | * | 6/2001 | Pradeep et al. ............. 438/595 |

* cited by examiner

Primary Examiner—Richard Booth
(74) Attorney, Agent, or Firm—George O. Saile; Rosemary L. S. Pike

(57) ABSTRACT

A new method of forming silicon nitride sidewall spacers has been achieved. In addition, a new device profile for a silicon nitride sidewall spacer has been achieved. An isolation region is provided overlying a semiconductor substrate. Polysilicon traces are provided. A liner oxide layer is formed overlying the polysilicon traces and the insulator layer. A silicon nitride layer is formed overlying the liner oxide layer. A polysilicon or amorphous silicon layer is deposited overlying the silicon nitride layer. The polysilicon or amorphous silicon layer is completely oxidized to form a temporary silicon dioxide layer. The temporary silicon dioxide layer is rounded in the corners due to volume expansion during the oxidation step. The temporary silicon dioxide layer is anisotropically etched through to expose horizontal surfaces of the silicon nitride layer while leaving vertical sidewalls of the temporary silicon dioxide layer. The silicon nitride layer is anisotropically etched to form silicon nitride sidewall spacers with an L-shaped profile. The integrated circuit device is completed.

16 Claims, 5 Drawing Sheets

METHOD TO FORM SELF-ALIGNED, L-SHAPED SIDEWALL SPACERS

BACKGROUND OF THE INVENTION (1) Field of the Invention

The invention relates to a method of fabricating semiconductor structures, and more particularly, to a method of forming self-aligned, L-shaped sidewall spacers adjacent to polysilicon traces and transistor gates in the manufacture of integrated circuit devices.

(2) Description of the Prior Art

Sidewall spacers are used in the generation of the lightly doped drain (LDD) region in transistor structures. The move from 0.35 microns to 0.25 microns and below necessitates the use of silicon nitride and silicon dioxide. The migration to silicon nitride provides an improved margin for the pre-salicide clean process. As the physical geometry of the emerging technologies is getting smaller, the processing for pattern transfer and deposition becomes more challenging, especially the interlevel dielectric (ILD) gap fill process. Forming the silicon nitride spacer by a conventional dry etch process proves very challenging. The complexity of such an etch process results in too much variation in the width of the spacer. This variation is particularly sensitive to variations in the concentration of devices across the circuit.

FIG. 1 illustrates an integrated circuit device of the prior art. A partially completed LDD transistor is shown. A semiconductor substrate 10 is shown. Shallow trench isolations 14 (STI) are formed in the semiconductor to isolate the active device area. A transistor gate is shown comprised of a thin gate oxide 22 and a polysilicon gate electrode 26. In practice, this polysilicon gate electrode 26 may be comprised of multiple levels of polysilicon or may include other resistivity lowering layers. The lightly doped drains 18 are implanted after the formation of the transistor gate and are, therefore, self-aligned to the gate.

An oxide liner layer 30 is formed overlying the polysilicon gate electrode 26. This oxide liner layer improves the adhesion of the silicon nitride. The silicon nitride layer 34 is deposited overlying the oxide liner layer 30.

Referring now to FIG. 2, the silicon nitride layer 34 and the oxide liner layer 30 are anisotropically etched, as conventional in the art, to form sidewall spacers adjacent to the polysilicon gates. The conventional etching process produces spacers with curved profiles 38.

With the decreasing device size, there are two main problems with the silicon nitride spacers formed in this process. First, it is difficult to produce consistent, low variation spacer widths because of the etching process. Second, though the sidewalls are curved, the sidewall profiles are too sharp. As the distance between polysilicon gates is decreased, it becomes very difficult to fill the gap between adjacent gates without creating voids in the interlevel dielectric material.

Several prior art approaches disclose methods to form and fabricate sidewall spacers. U.S. Pat. No. 5,661,049 to Lur et al teaches a process to form sidewalls for transistors. Voids are formed in the sidewalls for stress relief. Polysilicon is used for a portion of the sidewalls. U.S. Pat. No. 5,013,675 to Shen et al discloses a process to form polysilicon sidewall spacers and to remove them using an etchant. Silicon dioxide is used as a gate liner underlying the polysilicon spacers. U.S. Pat. No. 5,899,722 to Huang teaches a process to form sidewall spacers of silicon nitride by anisotropically etching a silicon nitride layer. U.S. Pat. No. 5,498,555 to Lin discloses processes to form sidewall spacers of: oxide-polysilicon, oxide-polysilicon-oxide, oxide-nitride, and oxide-nitride-oxide. U.S. Pat. No. 5,891,788 to Fazan et al teaches a process to form local oxidation of silicon (LOCOS) isolations using polysilicon spacers around a masking material. Co-pending U.S. patent application Ser. No. 09/439,368 (CS-99-066) to P. Yelehanka et al, filed on Oct. 28, 1999, teaches a 2-step insitu etch to form L-shaped nitride spacers.

SUMMARY OF THE INVENTION

A principal object of the present invention is to provide an effective and very manufacturable method of fabricating silicon nitride sidewall spacers adjacent to polysilicon traces and polysilicon transistor gates in the manufacture of integrated circuits.

A further object of the present invention is to provide a method to fabricate silicon nitride sidewall spacers with L-shaped profiles that improve dielectric material gap fill.

Another further object of the present invention is to provide a method to fabricate L-shaped sidewall spacers with improved process control of the width of the spacers.

In accordance with the objects of this invention, a new method of forming silicon nitride sidewall spacers has been achieved. A semiconductor substrate is provided. An isolation region is provided overlying the semiconductor substrate. Polysilicon traces are provided overlying the insulator layer. A liner oxide layer is formed overlying the polysilicon traces and the insulator layer. A silicon nitride layer is formed overlying the liner oxide layer. A polysilicon or amorphous silicon layer is deposited overlying the silicon nitride layer. The polysilicon or amorphous silicon layer is completely oxidized to form a temporary silicon dioxide layer. The temporary silicon dioxide layer is rounded in the corners due to volume expansion during the oxidation step. The temporary silicon dioxide layer is anisotropically etched through to expose the horizontal surfaces of the silicon nitride layer while leaving the vertical sidewalls of the temporary silicon dioxide layer. The temporary silicon dioxide layer and the silicon nitride layer are anisotropically etched to remove all of the temporary silicon dioxide layer and to form silicon nitride sidewall spacers. The presence of the specially shaped temporary silicon dioxide layer causes the silicon nitride sidewall spacers to form an L-shaped profile. The integrated circuit device is completed.

Also in accordance with the objects of this invention, L-shaped silicon nitride sidewalls having an improved interlevel dielectric gap filling ability are described. A semiconductor substrate is provided. An insulator layer overlays the semiconductor substrate. Polysilicon traces overlay the insulator layer. A liner oxide layer overlays the polysilicon traces. Silicon nitride sidewall spacers, with an L-shaped profile, ring the perimeter of the polysilicon traces and overlay the insulator layer. An interlevel dielectric layer overlays the polysilicon traces, silicon nitride sidewall spacers, and the insulator layer and fills the spaces between the silicon nitride sidewall spacers to complete the device.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of silicon nitride sidewall spacers in the manufacture of an integrated circuit device. It should be clear to those experienced in the art that the present invention can be applied and extended without deviating from the scope of the present invention.

Figure 1:
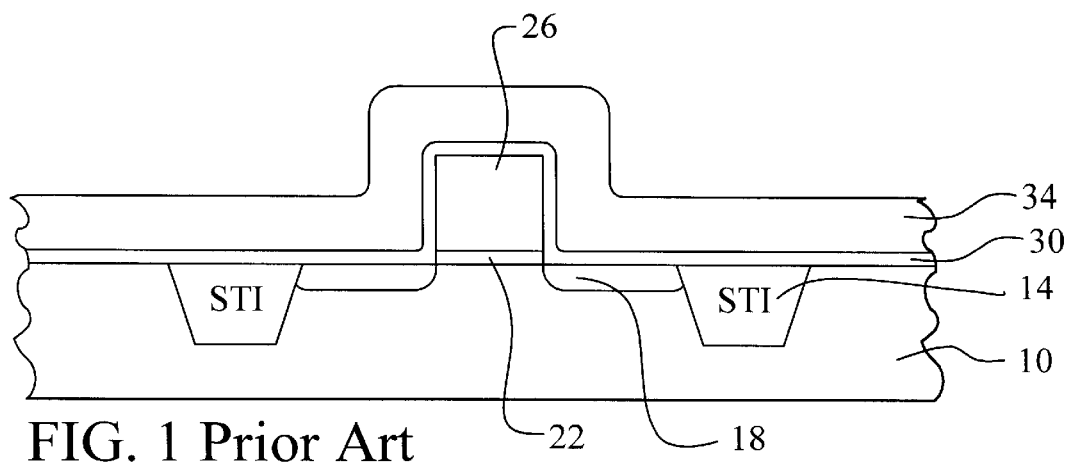
FIGS. 1 and 2 schematically illustrate in cross-section a partially completed prior art integrated circuit device.
Figure 2:
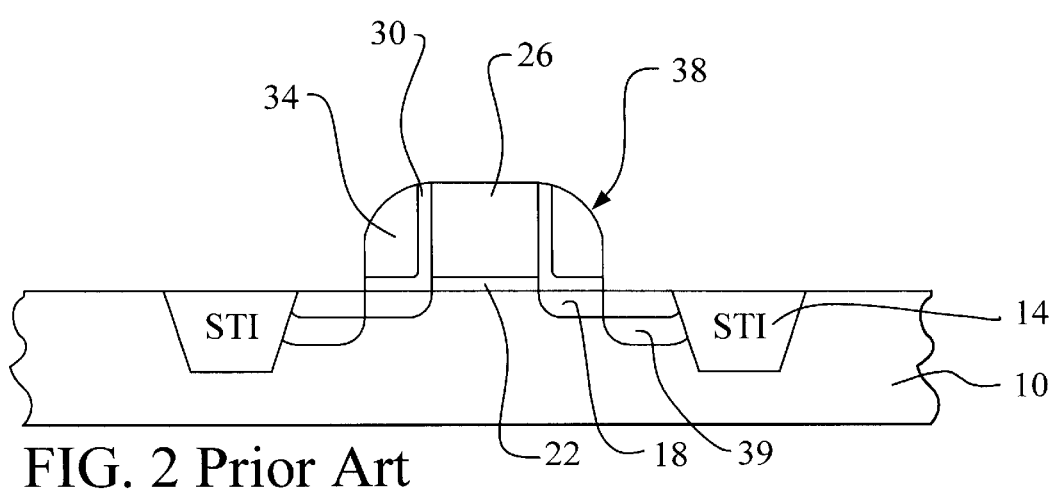
Figure 3:
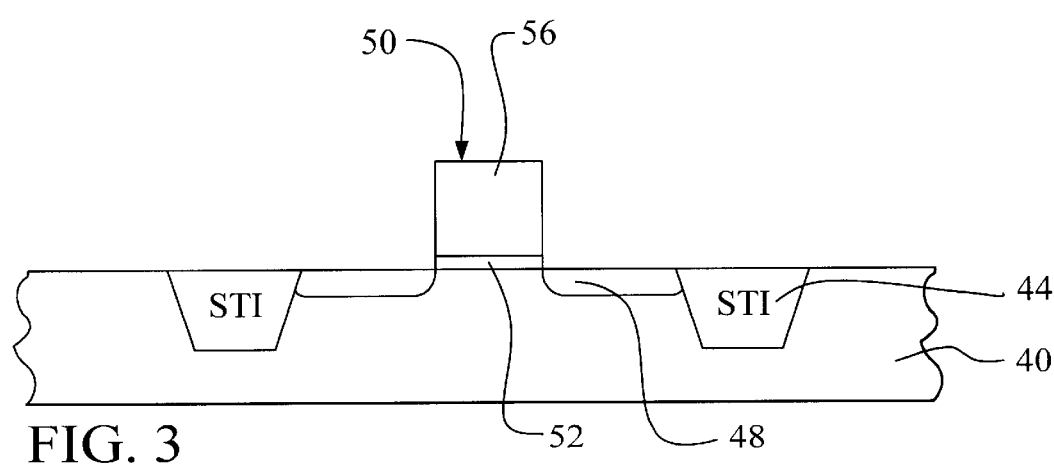
FIGS. 3 through 8 schematically illustrate in cross-sectional representation the preferred embodiment of the present invention.

Referring now particularly to FIG. 3, there is shown a cross section of a partially completed integrated circuit device of the preferred embodiment. In this embodiment, the present invention is used to form silicon nitride sidewall spacers in the fabrication of a lightly doped drain (LDD) MOSFET. Alternatively, the key process steps could be used to create silicon nitride sidewall spacers for a variety of situations where a polysilicon trace is formed overlying a substrate. A semiconductor substrate 40, typically consisting of monocrystalline silicon, is provided. Shallow trench isolations 44 (STI) are formed in the semiconductor substrate 40 in a conventional way. Alternatively, local oxidation of silicon (LOCOS) isolation could be used for isolating active areas.

Figure 10:
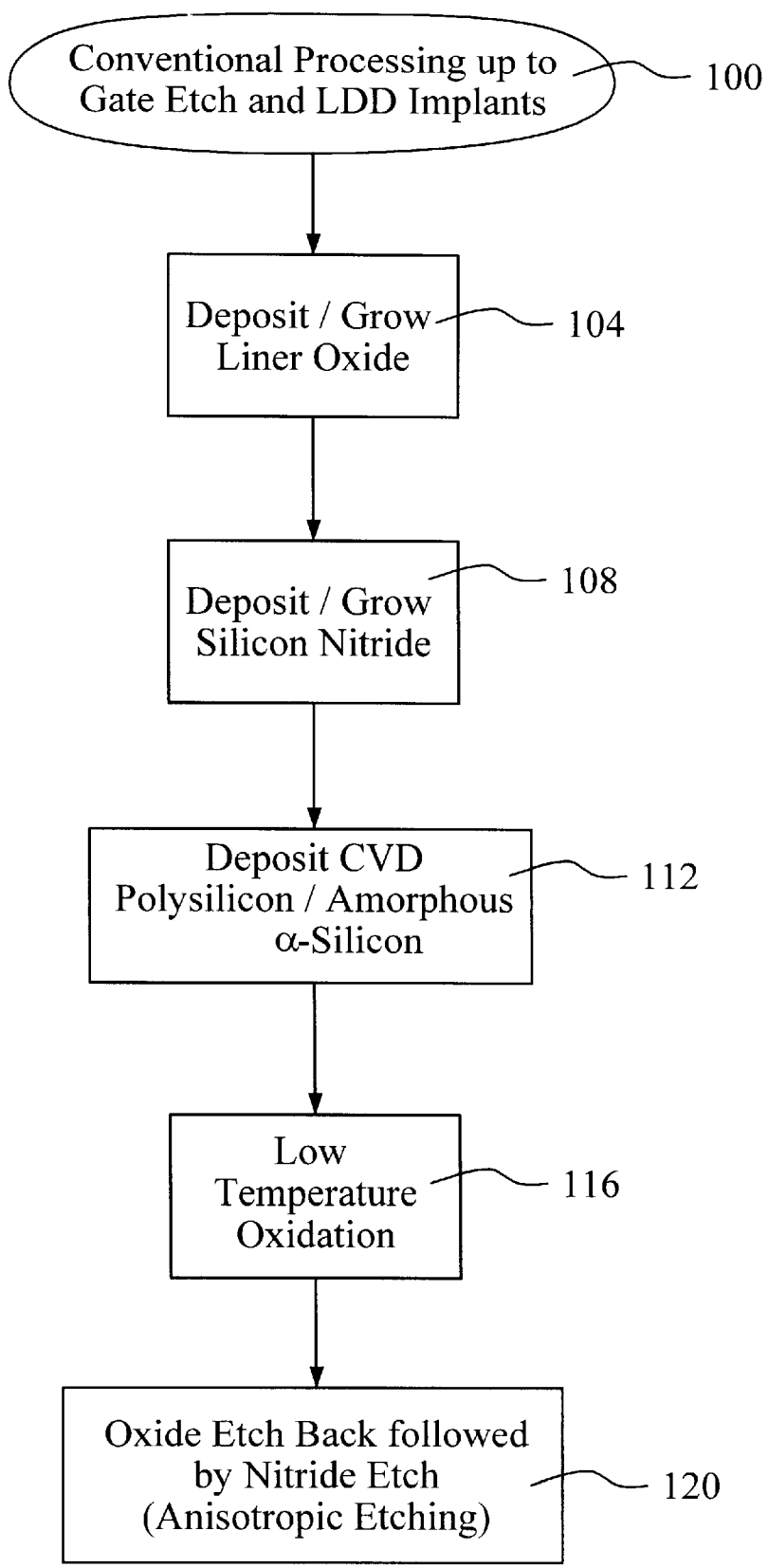
FIG. 10 illustrates a process flow chart of part of the fabrication sequence of the present invention.

A MOS transistor gate electrode 50 is formed overlying the semiconductor substrate 40. The MOS transistor gate electrode 50 is made up of a gate oxide layer 52 and a polysilicon gate layer 56. The MOS transistor gate electrode 50 is formed in a conventional way. First, a thin gate oxide layer 52 is either grown or deposited overlying the semiconductor substrate 40. The polysilicon gate layer 56 is then deposited, typically by a chemical vapor deposition (CVD) process, overlying the gate oxide layer 52. The polysilicon gate layer 56 and the gate oxide layer 52 are then patterned to form the individual MOS transistor gate electrodes 50. The LDD regions 48 are then formed. Ions are implanted into the semiconductor substrate 40 using the MOS transistor gate electrodes as masks. In this way, the LDD regions 48 are self-aligned to the MOS transistor gate electrodes. These first steps of the process are shown in the process flow of FIG. 10 as step 100.

Figure 4:
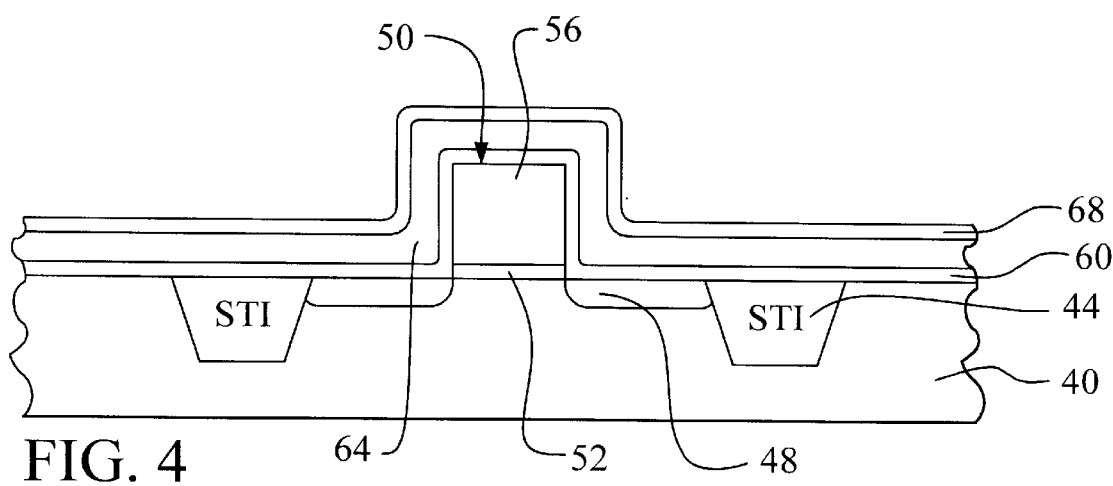

Referring now to FIG. 4, an important aspect of the present invention is shown. A liner oxide layer 60 is formed overlying the MOS transistor gate electrodes 50 and the semiconductor substrate 40. The liner oxide layer 60 improves the adhesion of the subsequently formed silicon nitride layer 64. The liner oxide layer 60 comprises silicon dioxide and may be formed either by a thermal oxidation or by a CVD deposition process. The liner oxide layer 60 is formed preferably to a thickness of between about 50 Angstroms and 300 Angstroms. This step of the process is shown in the process flow of FIG. 10 as step 104.

A silicon nitride layer 64 is formed overlying the liner oxide layer 60. This is an important feature of the present invention because the sidewall spacer will be formed in this layer. The silicon nitride layer 64 may be formed by a thermal furnace process or by a CVD process, as is conventional in the art. Due to the novel features of the present invention, the thickness of the silicon nitride layer 64 formed will determine the thickness of the sidewall spacer. In the preferred embodiment, the silicon nitride layer 64 is formed to a thickness of between about 100 Angstroms and 700 Angstroms. This step of the process is shown in the process flow of FIG. 10 as step 108.

A silicon layer 68, made up of either polysilicon or amorphous silicon, is deposited overlying the silicon nitride layer 64. The purpose of the silicon layer 68 is to subsequently form a silicon dioxide layer overlying the silicon nitride layer 64. The silicon layer 68 is deposited using a conventional CVD process to a thickness of between about 50 Angstroms and 400 Angstroms. This step of the process is shown in the process flow of FIG. 10 as step 112.

Figure 5:
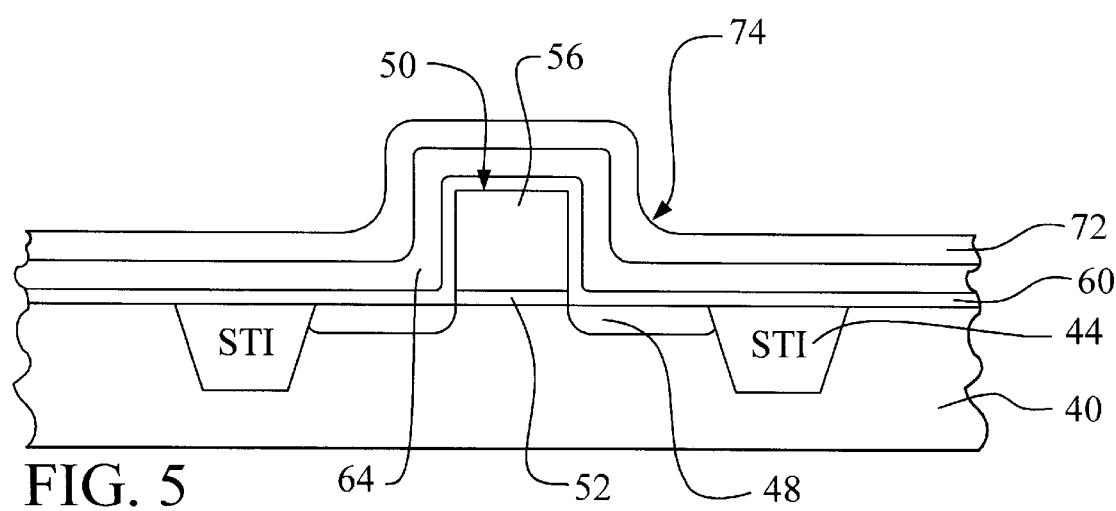

Referring now to FIG. 5, another important feature of the present invention is shown. The silicon layer 68 is completely oxidized to form a temporary silicon dioxide layer 72. The temporary silicon dioxide layer 72 is rounded in the corners 74 due to volume expansion during the oxidation step. This rounded corner profile 74 of the temporary silicon dioxide layer 72 is key to achieving the novel L-shape sidewall spacers in the present invention. The oxidation step is performed using a low temperature oxidation process with an oxidation temperature of between about 650 degrees C. and 800 degrees C., ambient gases comprising either $O_2$ and $H_2$ or $O_2$ and $N_2$, and additive gases comprising chlorine containing gases. This step of the process is shown in the process flow of FIG. 10 as step 116.

Figure 6:
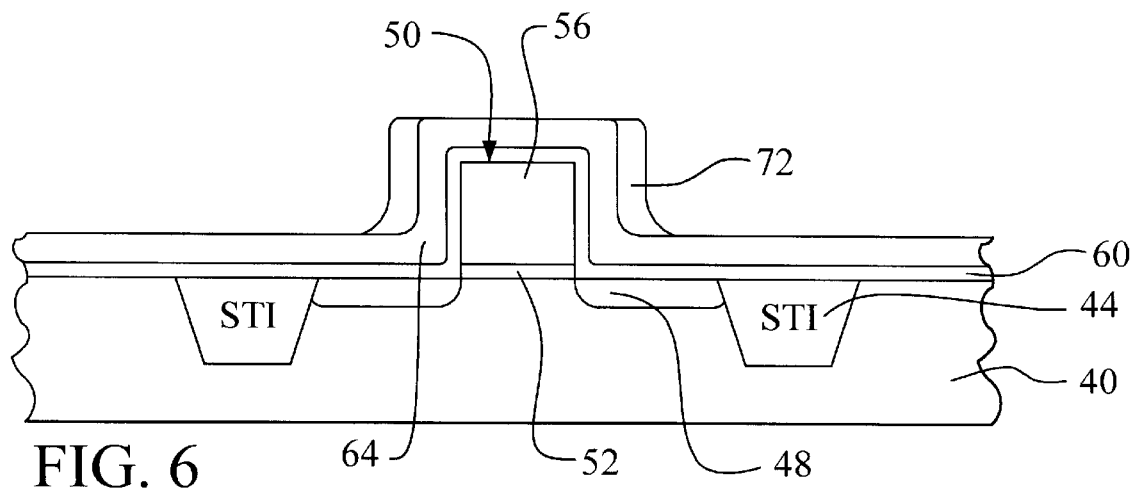
Figure 7:
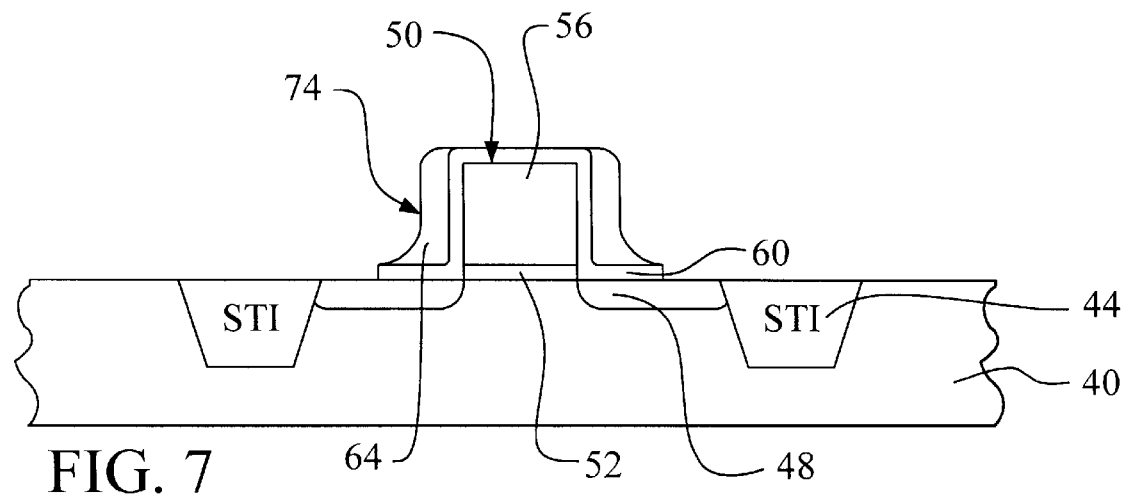

Referring now to FIGS. 6 and 7, another important aspect of the present invention is shown. A two-part etch is performed on the device. During the first part of the etch, the temporary silicon dioxide layer 72 is anisotropically etched through to expose the horizontal surfaces of the silicon nitride layer 64 yet leaving the vertical sidewalls of the temporary silicon dioxide layer 72. This step forms the novel shape of the sidewalls into the temporary silicon dioxide layer 72 as illustrated in FIG. 6. During the second part of the etch, the silicon nitride layer 64 is etched to complete the sidewall spacers 64 as illustrated in FIG. 7. The two-part anisotropic etching step is performed using reactive ion etching (RIE) with an etching chemistry comprising combinations of gases of the group of: $CF_4$, $CHF_3$, $C_2F_6$, $C_4H_8$, Ar, CO, $O_2$, $CH_3F$. Preferably, an etching chemistry of $C_4H_8$ and Ar is used during the silicon dioxide etching an etching chemistry of $CH_3F$ and $O_2$ is used during the silicon nitride etching. This step of the process is shown in the process flow of FIG. 10 as step 120.

Note that the profile of the temporary silicon dioxide layer 72 formed after the first part of the etching effectively transferred to the underlying silicon nitride sidewall spacers 64 during the second part of the etching step. The presence of the specially shaped temporary silicon dioxide layer 72 provides a barrier during the spacer etch that inhibits lateral etching of the silicon nitride layer 64. Therefore, the novel L-shape 74 is etched into the silicon nitride layer 64. In addition, because the temporary silicon dioxide layer 72 inhibits lateral etching, local and global etch microloading effects do not effect the final dimensions of the silicon nitride sidewall spacers as in the prior art. Finally, any remaining temporary silicon dioxide layer 72 that is not removed during the etch is removed during the subsequent pre-salicide cleaning step. The two-part etching step of the process is also shown in the process flow of FIG. 10 as step 120.

Figure 8:
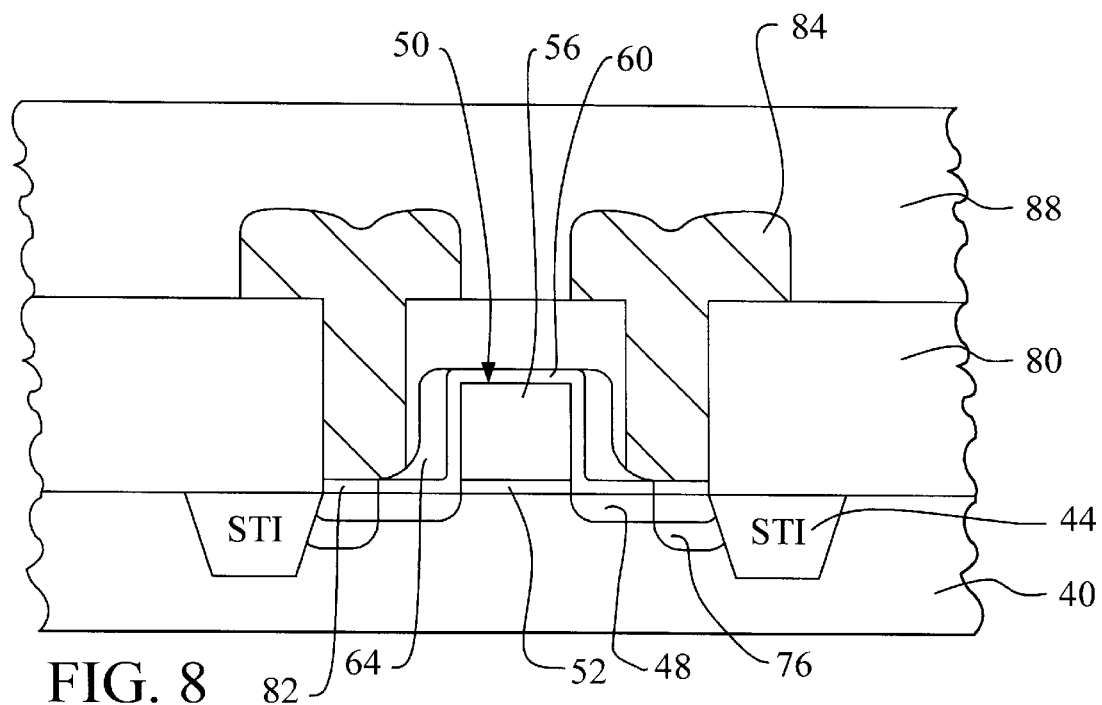

Referring now to FIG. 8, one completed transistor formed using the present invention is shown. For example, highly doped source and drain regions 76 are implanted into the semiconductor substrate using the silicon nitride sidewall spacers 64 as masks. These regions 76 are therefore self-aligned to the sidewall spacers 64. A pre-salicide clean is performed (which removes any residual temporary silicon dioxide layer 72). A self-aligned silicide layer (salicide) 82 is formed overlying the source and drain junctions 76. An interlevel dielectric layer 80 is deposited overlying the transistor gates 50, the silicon nitride sidewall spacers 64, and the silicide layer 82. This interlevel dielectric layer 80 is preferably comprised of: TEOS undoped oxide, boron phosphosilicate glass (BPSG), undoped silicon dioxide, and an optional etch stopping layer of either silicon nitride or silicon oxynitride. Openings are etched through the interlevel dielectric layer 80 for contacts. A metal layer 84 is deposited overlying the interlevel dielectric layer 80 and filling the contact openings. The metal layer 84 is patterned to form connective traces. A passivation layer is deposited overlying the metal layer 84 and the interlevel dielectric layer 80 to complete the integrated circuit device.

Figure 9:
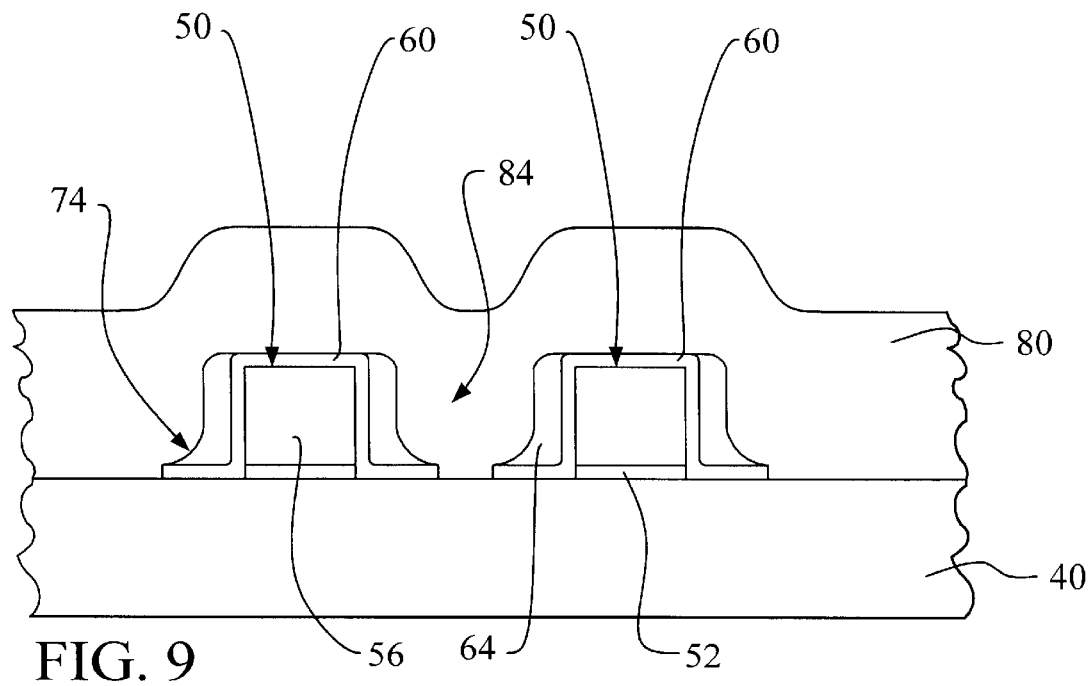
FIG. 9 schematically illustrates an alternative cross-sectional representation of the preferred embodiment of the present invention.

Referring now to FIG. 9, an alternative cross section of a partially completed integrated circuit device of the present invention is shown. This detail shows the positive effect of the unique silicon nitride sidewall spacer L-shape 74. Two polysilicon gates 50 with the silicon nitride sidewall spacers 64 are formed in close proximity. The interlevel dielectric layer 80 is deposited overlying the two polysilicon gates 50, the silicon nitride sidewall spacers 64, and the semiconductor substrate 40. The L-shaped profile of the silicon nitride sidewall spacers 64 allows the interlevel dielectric layer 80 to fill the gap 84 between the gates 50 without creating any voids. This allows the two polysilicon gates 50 to be placed closely together and improves the density of the design.

Referring again to FIG. 9, the novel device formed by the process of the present invention is illustrated. An insulator layer 52, also described as the thin gate oxide layer 52, overlies the semiconductor substrate 40. Polysilicon traces 56, also described as the polysilicon gate layer 56, overlies the insulator layer 52. A liner oxide layer 60 overlies the polysilicon traces 56. Silicon nitride spacers 64 adjoin sidewalls of the polysilicon traces 56 and overlies the liner oxide layer 60. The silicon nitride spacers 64 have an L-shape profile 74. An interlevel dielectric layer 80 overlies the polysilicon traces 56, the silicon nitride spacers 64, and the liner oxide layer 60.

As shown in the preferred embodiments, the present invention provides a very manufacturable process for fabricating silicon nitride sidewall spacers in an integrated circuit device. In addition, a novel L-shaped silicon nitride sidewall spacer profile is achieved. The present invention improves the device density by improving dielectric gap fill between adjacent polysilicon gates or traces. It also improves the device to device process control by eliminating the effect of etch microloading during the sidewall spacer etch.

While the invention has been particularly shown and described with reference to the preferred embodiments thereof, it will be understood by those skilled in the art that various changes in form and details may be made without departing from the spirit and scope of the invention.

What is claimed is:

1. A method to fabricate silicon nitride sidewall spacers in the manufacture of an integrated circuit device comprising:

providing an insulating layer overlying a semiconductor substrate;

providing polysilicon traces overlying said insulating layer;

forming a liner oxide layer overlying said polysilicon traces and said insulating layer;

forming a silicon nitride layer overlying said liner oxide layer;

depositing a silicon layer overlying said silicon nitride layer;

oxidizing completely said silicon layer to form a temporary silicon dioxide layer wherein the corners of said temporary silicon dioxide layer are rounded due to volume expansion during said oxidizing step;

anisotropically etching said temporary silicon dioxide layer to expose horizontal surfaces of said silicon nitride layer while leaving vertical surfaces of said temporary silicon dioxide layer remaining; and thereafter anisotropically etching said exposed silicon nitride layer to form said silicon nitride sidewall spacers in the manufacture of the integrated circuit device.

2. The method according to claim 1 wherein said polysilicon traces comprise transistor gates.

3. The method according to claim 1 wherein said liner oxide layer is formed to a thickness of between about 50 Angstroms and 300 Angstroms.

4. The method according to claim 1 wherein said silicon nitride layer is formed by one of the group of: growing by thermal process and depositing by chemical vapor deposition.

5. The method according to claim 1 wherein said silicon nitride layer is formed to a thickness of between about 100 Angstroms and 700 Angstroms.

6. The method according to claim 1 wherein said silicon layer is deposited to a thickness of between about 50 Angstroms and 400 Angstroms.

7. The method according to claim 1 wherein said silicon layer comprises one of the group of: polysilicon and amorphous silicon.

8. The method according to claim 1 wherein said step of oxidizing completely is by a low temperature oxidation process with an oxidation temperature of between about 650 degrees C. and 800 degrees C., additive gases comprising chlorine containing gases, and ambient gases comprising one of the group of: $O_2$ with $H_2$ and $O_2$ with $N_2$.

9. The method according to claim 1 wherein said silicon nitride sidewall spacers have an L-shaped profile.

10. A method to fabricate transistors with silicon nitride sidewall spacers in the manufacture of an integrated circuit device comprising:

providing a semiconductor substrate;

providing polysilicon transistor gates overlying said semiconductor substrate wherein said polysilicon transistor gates comprise: a thin gate oxide layer overlying said semiconductor substrate, a polysilicon gate electrode overlying said thin gate oxide layer, and lightly doped drains formed in said semiconductor substrate;

forming a liner oxide layer overlying said polysilicon gates and said semiconductor substrate;

forming a silicon nitride layer overlying said liner oxide layer;

depositing a silicon layer overlying said silicon nitride layer wherein said silicon layer comprises one of the group of: polysilicon and amorphous silicon;

oxidizing completely said silicon layer to form a temporary silicon dioxide layer wherein the corners of said temporary silicon dioxide layer are rounded due to volume expansion during the oxidation step;

anisotropically etching said temporary silicon dioxide layer to expose horizontal surfaces of said silicon nitride layer while leaving vertical surfaces of said temporary silicon dioxide layer remaining;

anisotropically etching said exposed silicon nitride layer to form L-shaped silicon nitride sidewall spacers; and depositing an interlevel dielectric layer overlying said polysilicon transistor gates and said silicon nitride sidewall spacers to complete transistors in the manufacture of said integrated circuit device.

11. The method according to claim 10 wherein said liner oxide layer is formed to a thickness of between about 50 Angstroms and 300 Angstroms.

12. The method according to claim 10 wherein said silicon nitride layer is formed by one of the group of: growing by thermal process and depositing by chemical vapor deposition.

13. The method according to claim 10 wherein said silicon nitride layer is formed to a thickness of between about 100 Angstroms and 700 Angstroms.

14. The method according to claim 10 wherein said silicon layer is deposited to a thickness of between about 50 Angstroms and 400 Angstroms.

15. The method according to claim 10 wherein said step of oxidizing completely is by a low temperature oxidation process with an oxidation temperature of between about 650 degrees C. and 800 degrees C., additive gases comprising chlorine containing gases, and ambient gases comprising one of the group of: $O_2$ with $H_2$ and $O_2$ with $N_2$.

16. The method according to claim 10 wherein said interlevel dielectric layer comprises a combination material from the group of: TEOS undoped oxide, boron phosphosilicate glass (BPSG), undoped silicon dioxide, silicon nitride, and silicon oxynitride.

* * * * *

UNITED STATES PATENT AND TRADEMARK OFFICE
CERTIFICATE OF CORRECTION

PATENT NO. : 6,391,732 B1  Page 1 of 1
DATED : May 21, 2002
INVENTOR(S) : Subhash Gupta, Yelehanka Ramachandramurthy Pradeep and Vijai Kumar Chhagan It is certified that error appears in the above-identified patent and that said Letters Patent is hereby corrected as shown below:

<u>Title page,</u>
Item [75], Inventors, please delete "Yelehanka Ramachandramurthy", and replace with -- Yelehanka Ramachandramurthy Pradeep --.

Signed and Sealed this

Nineteenth Day of November, 2002

*Attest:*

*Attesting Officer*

JAMES E. ROGAN
*Director of the United States Patent and Trademark Office*